(12) United States Patent
Noh et al.

(10) Patent No.: US 12,269,124 B2
(45) Date of Patent: Apr. 8, 2025

(54) LASER APPARATUS AND METHOD FOR MANUFACTURING DISPLAY DEVICE

(71) Applicants: Samsung Display Co., Ltd., Yongin-si (KR); Philoptics Co., Ltd., Suwon-si (KR)

(72) Inventors: Sung Ho Noh, Cheonan-si (KR); Jae Yoon Jeong, Hwaseong-si (KR); Jun Ho Sim, Cheonan-si (KR); Jae Ku Han, Anyang-si (KR)

(73) Assignees: Samsung Display Co., Ltd., Yongin-si (KR); Philoptics Co., Ltd., Suwon-si (KR)

( * ) Notice: Subject to any disclaimer, the term of this patent is extended or adjusted under 35 U.S.C. 154(b) by 811 days.

(21) Appl. No.: 17/381,631

(22) Filed: Jul. 21, 2021

(65) Prior Publication Data
US 2022/0023976 A1   Jan. 27, 2022

(30) Foreign Application Priority Data
Jul. 21, 2020 (KR) .......................... 10-2020-0090387

(51) Int. Cl.
*B23K 26/402* (2014.01)
*B23K 26/08* (2014.01)
*B23K 26/082* (2014.01)
*B23K 26/70* (2014.01)
*C03B 33/08* (2006.01)
(Continued)

(52) U.S. Cl.
CPC .......... *B23K 26/402* (2013.01); *B23K 26/082* (2015.10); *B23K 26/083* (2013.01); *B23K 26/702* (2015.10); *B23K 26/703* (2015.10); *C03B 33/082* (2013.01); *B23K 2101/36* (2018.08); *H01L 25/18* (2013.01); *H10K 77/111* (2023.02)

(58) Field of Classification Search
CPC .. B23K 26/082; B23K 26/702; B23K 26/703; B23K 26/083; B23K 2101/36; C03B 33/082; H10K 77/111; H01L 25/18
USPC .................................................. 219/121.67
See application file for complete search history.

(56) References Cited

U.S. PATENT DOCUMENTS 4,278,867 A * 7/1981 Tan ...................... B23K 26/123
                                                                219/121.64
4,535,218 A * 8/1985 Krause ................. B23K 26/073
                                                                219/121.68
(Continued)

FOREIGN PATENT DOCUMENTS

JP    2004-337902 A   12/2004
JP    2008-170579 A    7/2008
(Continued)

*Primary Examiner* — Jimmy Chou
(74) *Attorney, Agent, or Firm* — Womble Bond Dickinson (US) LLP

(57) ABSTRACT

A laser apparatus and a method for manufacturing a display device are provided. A laser apparatus includes: a stage; a laser providing unit above the stage and configured to provide a laser beam; a scanner configured to adjust an optical path of the laser beam such that the laser beam is irradiated to an irradiation line formed above the stage; and a control unit to control an operation of the scanner, and the scanner includes a shutter located on an optical path of the laser beam emitted from the laser providing unit and configured to perform an opening/closing operation.

12 Claims, 12 Drawing Sheets

(51) Int. Cl.
　　　*B23K 101/36*　　　(2006.01)
　　　*H01L 25/18*　　　(2023.01)
　　　*H10K 77/10*　　　(2023.01)

(56) References Cited

U.S. PATENT DOCUMENTS

| | | | | |
|---|---|---|---|---|
| 4,568,815 A * | 2/1986 | Kimbara | B23K 26/0846 | 219/121.6 |
| 4,727,234 A * | 2/1988 | Oprysko | G03F 1/72 | 427/140 |
| 4,752,668 A * | 6/1988 | Rosenfield | G03F 1/72 | 219/121.85 |
| 4,847,462 A * | 7/1989 | Soodak | B29C 66/001 | 219/121.75 |
| 5,063,280 A * | 11/1991 | Inagawa | H05K 3/0038 | 219/121.78 |
| 5,122,659 A * | 6/1992 | Agano | G01T 1/2014 | 250/236 |
| 5,302,798 A * | 4/1994 | Inagawa | B23K 26/382 | 219/121.77 |
| 6,087,625 A * | 7/2000 | Iso | B23K 26/082 | 219/121.76 |
| 6,140,602 A * | 10/2000 | Costin | D06Q 1/00 | 219/121.68 |
| 6,369,356 B1 * | 4/2002 | Beck | G01J 1/4257 | 219/121.72 |
| 6,649,861 B2 * | 11/2003 | Duignan | B23K 15/0006 | 219/121.68 |
| 6,720,519 B2 * | 4/2004 | Liu | B23K 26/067 | 219/121.75 |
| 6,872,913 B1 * | 3/2005 | Jendick | B23K 26/0846 | 347/225 |
| 7,680,163 B2 * | 3/2010 | Shida | B23K 26/04 | 219/121.75 |
| 7,709,768 B2 * | 5/2010 | Sercel | B23K 26/40 | 219/121.75 |
| 9,842,740 B2 * | 12/2017 | Mastain | B23K 26/032 | |
| 10,688,599 B2 * | 6/2020 | Liu | B23K 26/0617 | |
| 10,730,783 B2 * | 8/2020 | Akarapu | C03B 33/082 | |
| 2002/0162825 A1 * | 11/2002 | Lizotte | B23K 26/043 | 219/121.73 |
| 2002/0179580 A1 * | 12/2002 | Costin | D06M 10/005 | 219/121.68 |
| 2003/0006221 A1 * | 1/2003 | Hong | H01L 21/3043 | 219/121.72 |
| 2004/0262275 A1 * | 12/2004 | Kuroiwa | B23K 26/382 | 219/121.77 |
| 2005/0111504 A1 * | 5/2005 | Nishikawa | H01S 3/1312 | 372/38.07 |
| 2005/0139582 A1 * | 6/2005 | Tanaka | B23K 26/0665 | 219/121.75 |
| 2005/0184036 A1 * | 8/2005 | Hunter | B23K 26/046 | 219/121.61 |
| 2007/0193984 A1 * | 8/2007 | Kawai | B23K 26/0884 | 219/121.75 |
| 2008/0116183 A1 * | 5/2008 | Curry | B23K 26/40 | 219/121.75 |
| 2008/0129950 A1 * | 6/2008 | Abe | G02F 1/1309 | 349/192 |
| 2009/0032510 A1 * | 2/2009 | Ando | B23K 26/0676 | 219/121.72 |
| 2009/0310112 A1 * | 12/2009 | Kazaana | G03F 7/70425 | 355/67 |
| 2010/0108648 A1 * | 5/2010 | Koseki | B23K 26/12 | 219/121.84 |
| 2010/0197116 A1 * | 8/2010 | Shah | B23K 26/083 | 219/121.68 |
| 2011/0136265 A1 * | 6/2011 | Shigenobu | H01L 31/208 | 438/4 |
| 2011/0233178 A1 * | 9/2011 | Cheng | H01L 21/67092 | 219/121.72 |
| 2011/0240617 A1 * | 10/2011 | Xu | B23K 26/38 | 219/121.72 |
| 2011/0253685 A1 * | 10/2011 | Hsu | B23K 26/40 | 219/121.67 |
| 2011/0290769 A1 * | 12/2011 | Furuta | B23K 26/40 | 219/121.72 |
| 2012/0024829 A1 * | 2/2012 | Huang | B23K 26/355 | 219/121.68 |
| 2012/0111310 A1 * | 5/2012 | Ryu | C03B 33/091 | 125/30.01 |
| 2012/0181454 A1 * | 7/2012 | Kubota | B23K 26/355 | 250/492.1 |
| 2012/0255938 A1 * | 10/2012 | Oe | B23K 26/0884 | 901/41 |
| 2012/0325784 A1 * | 12/2012 | Moffatt | B23K 26/354 | 219/121.61 |
| 2013/0051409 A1 * | 2/2013 | Grapov | G02B 27/144 | 372/6 |
| 2013/0134142 A1 * | 5/2013 | Morikazu | B23K 26/073 | 219/121.75 |
| 2013/0175243 A1 * | 7/2013 | Wang | B23K 26/382 | 219/121.7 |
| 2014/0083986 A1 * | 3/2014 | Zhang | B23K 26/40 | 219/121.68 |
| 2014/0256161 A1 * | 9/2014 | Li | B23K 26/352 | 438/795 |
| 2014/0291304 A1 * | 10/2014 | Mudd, II | B23K 26/20 | 219/121.64 |
| 2014/0312469 A1 * | 10/2014 | Shah | B23K 26/40 | 438/798 |
| 2015/0060421 A1 * | 3/2015 | Tami | B23K 26/0853 | 219/121.77 |
| 2015/0144607 A1 * | 5/2015 | Gesuita | B23K 26/1462 | 219/121.67 |
| 2015/0217402 A1 * | 8/2015 | Hesse | B23K 26/08 | 219/121.72 |
| 2016/0001402 A1 * | 1/2016 | Martinsen | G02B 26/105 | 219/121.68 |
| 2016/0008920 A1 * | 1/2016 | Goya | B23K 26/36 | 219/121.61 |
| 2016/0372349 A1 * | 12/2016 | Hyakumura | B23K 26/046 | |
| 2017/0320165 A1 * | 11/2017 | Hyakumura | B23K 26/046 | |
| 2018/0133842 A1 | 5/2018 | Jeong et al. | | |
| 2019/0151997 A1 * | 5/2019 | Blázquez-Sanchez | B23K 26/0648 | |
| 2019/0193197 A1 * | 6/2019 | Ishikawa | B23K 26/0853 | |
| 2019/0262939 A1 * | 8/2019 | Hesse | B23K 26/0613 | |
| 2019/0375051 A1 * | 12/2019 | Regaard | B23K 26/38 | |
| 2020/0189029 A1 * | 6/2020 | Ishiguro | B23K 26/0734 | |
| 2020/0214138 A1 * | 7/2020 | Arai | H05K 3/0038 | |
| 2021/0107091 A1 * | 4/2021 | Riechel | B23K 26/0624 | |
| 2022/0023976 A1 * | 1/2022 | Noh | B23K 26/402 | |
| 2022/0319888 A1 * | 10/2022 | Cai | B23K 26/38 | |
| 2023/0061635 A1 * | 3/2023 | Riechel | B23K 26/0622 | |
| 2023/0226640 A1 * | 7/2023 | Heinrici | B23K 26/0648 | 219/121.75 |
| 2023/0415261 A1 * | 12/2023 | Oguchi | B23K 26/0608 | |
| 2024/0033858 A1 * | 2/2024 | Haas | B23K 26/0884 | |

FOREIGN PATENT DOCUMENTS

| | | |
|---|---|---|
| KR | 10-2010-0107252 A | 10/2010 |
| KR | 2017-0125212 A | 11/2017 |
| KR | 10-2018-0055979 A | 5/2018 |
| KR | 2009-0015212 A | 2/2024 |

* cited by examiner

LASER APPARATUS AND METHOD FOR MANUFACTURING DISPLAY DEVICE

CROSS-REFERENCE TO RELATED APPLICATION

This application claims priority to and the benefit of Korean Patent Application No. 10-2020-0090387, filed on Jul. 21, 2020 in the Korean Intellectual Property Office, the entire content of which is herein incorporated by reference.

BACKGROUND

1. Field

Aspects of embodiments of the present disclosure relate to a laser apparatus and a method for manufacturing a display device.

2. Description of the Related Art

The importance of display devices has steadily increased with the development of multimedia technology. In response thereto, various types of display devices, such as liquid crystal display devices, organic light emitting display devices, and the like, are being used.

In a manufacturing process of a display device, a laser beam may be used to cut the display device to a desired dimension and shape. The laser beam may be moved on a target substrate in the same direction as that of a cutting line while repetitively swinging forward and backward by a distance (e.g., a predetermined distance).

SUMMARY

According to an aspect of embodiments of the present disclosure, a laser apparatus capable of uniformly irradiating a laser beam to each section of a laser beam irradiation line, and a method for manufacturing a display device are provided.

However, aspects of the present disclosure are not restricted to those set forth herein. The above and other aspects of the present disclosure will become more apparent to one of ordinary skill in the art to which the present disclosure pertains by referencing the detailed description of the present disclosure provided below.

According to one or more embodiments, a laser apparatus includes: a stage; a laser providing unit above the stage and configured to provide a laser beam; a scanner configured to adjust an optical path of the laser beam such that the laser beam is irradiated to an irradiation line formed above the stage; and a control unit to control an operation of the scanner, and the scanner includes a shutter located on an optical path of the laser beam emitted from the laser providing unit and configured to perform an opening/closing operation.

According to one or more embodiments, a laser apparatus includes: a laser providing unit configured to emit a laser beam during a first period and a second period; an optical path adjustment unit configured to adjust an angle at which the laser beam travels; and a shutter located on a traveling path of the laser beam, wherein the shutter is opened during the first period to allow the emitted laser beam to travel, and is closed during the second period to block travel of the emitted laser beam.

According to one or more embodiments, a method for manufacturing a display device includes: irradiating a laser beam along a cutting line on a target substrate according to an irradiation pattern, wherein the irradiating of the laser beam onto the target substrate according to the irradiation pattern includes, when a position of a target aiming point of the laser beam is located in a processing area, opening a shutter if a moving speed of the target aiming point of the laser beam is higher than or equal to a reference speed, and closing the shutter if the moving speed of the target aiming point of the laser beam is lower than the reference speed.

According to an aspect of one or more embodiments of a laser apparatus and a method for manufacturing a display device, it is possible to uniformly irradiate a laser beam to each region of a cutting line of a target substrate.

Aspects and effects of the present disclosure are not limited to the aforementioned aspects and effects, and various other aspects and effects are included in the present specification.

BRIEF DESCRIPTION OF THE DRAWINGS

The above and other aspects and features of the present disclosure will become more apparent by describing in further detail some embodiments thereof with reference to the attached drawings, in which.

DETAILED DESCRIPTION

Figure 1:
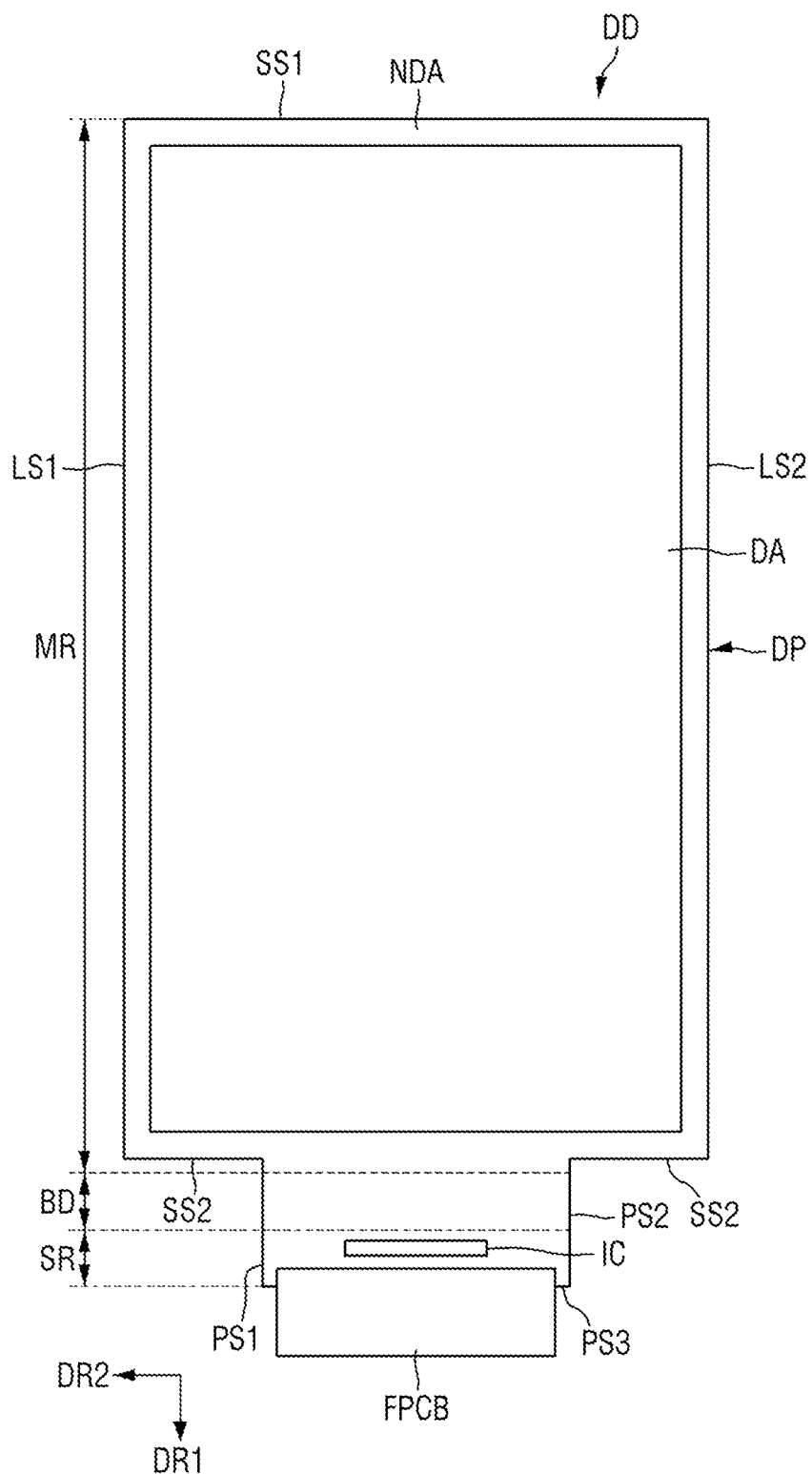
FIG. 1 is a plan view of a display device according to an embodiment.

The present invention will now be described more fully herein with reference to the accompanying drawings, in which some embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It is also to be understood that when a layer is referred to as being "on" another layer or substrate, it may be directly on the other layer or substrate, or one or more intervening layers may also be present. In contrast, when an element is referred to as being "directly on" another element, there are no intervening elements present.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below. The device may be otherwise oriented (rotated 90 degrees or at other orientations) and the spatially relative descriptors used herein interpreted accordingly.

The same reference numbers indicate the same components throughout the specification.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a "first" element, component, region, layer, or section discussed below could be termed a "second" element, component, region, layer, or section without departing from the teachings of the inventive concept.

The meaning of "include" or "comprise" may specify a property, a fixed number, a step, an operation, an element, a component, or a combination thereof, but does not exclude other properties, fixed numbers, steps, operations, elements, components, or combinations thereof.

Unless otherwise defined, all terms (including technical and scientific terms) used herein have the same meaning as commonly understood by one of ordinary skill in the art to which example embodiments of the inventive concepts belong. It is to be further understood that terms, such as those defined in commonly-used dictionaries, should be interpreted as having a meaning that is consistent with their meaning in the context of the relevant art and are not to be interpreted in an idealized or overly formal sense unless expressly so defined herein.

Herein, embodiments will be described in further detail with reference to the accompanying drawings.

Figure 2:
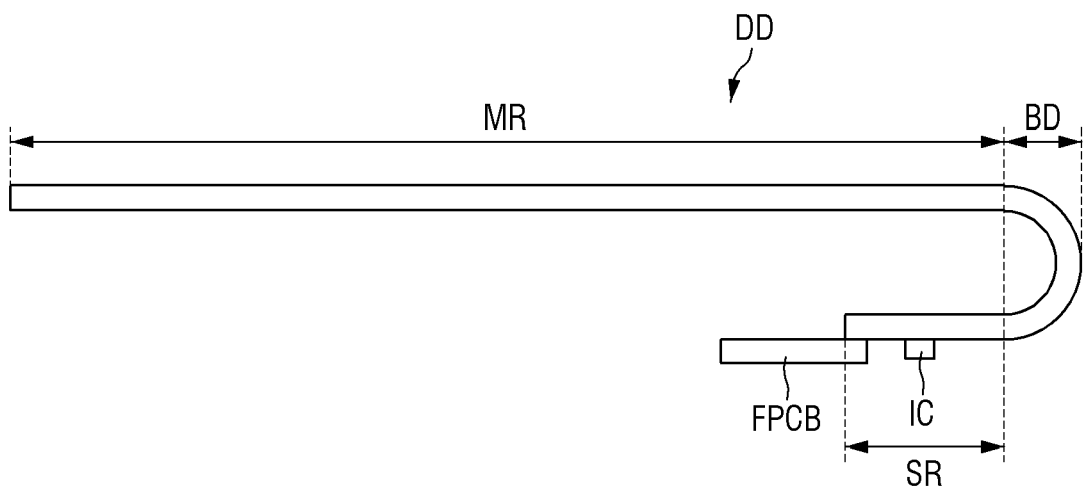
FIG. 2 is a schematic partial cross-sectional view of a display device according to an embodiment.

FIG. 1 is a plan view of a display device according to an embodiment; and FIG. 2 is a schematic partial cross-sectional view of a display device according to an embodiment.

Referring to FIGS. 1 and 2, a display device DD is a device for displaying a moving image or a still image. The display device DD may be used as a display screen of any of various products, such as televisions, laptop computers, monitors, billboards, and the Internet of Things, as well as portable electronic devices, such as mobile phones, smartphones, tablet personal computers (tablet PCs), smart watches, watch phones, mobile communication terminals, electronic notebooks, electronic books, portable multimedia players (PMPs), navigation systems, and ultra-mobile PCs (UMPCs). Examples of the display device DD may include an organic light emitting display device, a liquid crystal display device, a plasma display device, a field emission display device, an electrophoretic display device, an electrowetting display device, a quantum dot light emitting display device, a micro LED display device, and the like. Herein, an organic light emitting display device is described as an example of the display device DD, but the present disclosure is not limited thereto.

The display device DD may include a display panel DP. In an embodiment, the display panel DP may include a flexible substrate including a flexible polymer material, such as polyimide. Accordingly, the display panel DP can be twisted, bent, folded, or rolled. However, without being limited thereto, the display panel DP may include a glass substrate made of a glass-based material.

The display panel DP may include a main region MR and a bending region BD connected to a side of the main region MR in a first direction DR1. The display panel DP may further include a sub-region SR which is connected to the bending region BD and overlaps the main region MR in a thickness direction. The bending region BD and the sub-region SR may have a shape protruding from the main region MR in the first direction DR1.

An area of the display panel DP where a screen is displayed may be defined as a display area DA, and an area of the display panel DP where the screen is not displayed may be defined as a non-display area NDA. The display area DA of the display panel DP may be disposed in the main region MR. The rest of the display panel DP except the display area DA may be the non-display area NDA. In an embodiment, a peripheral edge portion of the display area DA in the main region MR, the entire bending region BD, and the entire sub-region SR may be the non-display area NDA. However, the present disclosure is not limited thereto, and the bending region BD and/or the sub-region SR may also include the display area DA.

The main region MR may have a shape substantially similar to an outer shape of the display device DD in a plan view. In an embodiment, the main region MR may be a flat region located on one plane. However, the present disclosure is not limited thereto, and at least one edge of the remaining edges except an edge of the main region MR connected to the bending region BD may be bent in a curved shape or bent in a vertical direction.

In an embodiment, the display area DA of the display panel DP may be disposed at the center of the main region MR. The display area DA may include a plurality of pixels. In an embodiment, the display area DA may have a rectangular shape or a rectangular shape with rounded corners. However, the present disclosure is not limited thereto, and the display area DA may have any of various shapes, such as a square, a polygon, a circle, an ellipse, or the like.

The non-display area NDA may be located around the display area DA in the main region MR. The non-display area NDA of the main region MR may be located in an area from the outer boundary of the display area DA to an edge of the display panel DP. Signal lines or driving circuits may be disposed in the non-display area NDA of the main region MR to apply a signal to the display area DA.

In the bending region BD, the display panel DP may be bent with a curvature downward in a thickness direction, i.e., in a direction opposite to a display surface. In an embodiment, the bending region BD may have a constant radius of curvature. However, without being limited thereto, the bending region BD may have a different radius of curvature for each section. In an embodiment, the surface of the display panel DP may be reversed as the display panel DP is bent in the bending region BD. In other words, a surface of the display panel DP facing upward may be changed to face outward through the bending region BD and then to face downward.

The sub-region SR may extend from the bending region BD. The sub-region SR may extend in a direction parallel to the main region MR from a point where bending is completed. The sub-region SR may overlap the main region MR in the thickness direction of the display panel DP. The sub-region SR may overlap the non-display area NDA of the edge of the main region MR and further overlap the display area DA of the main region MR. In an embodiment, the width of the sub-region SR may be the same as the width of the bending region BD, but is not limited thereto.

The display panel DP may include a first short side SS1 disposed on the other side of the first direction DR1 of the main region MR and extending in a second direction DR2, a first long side LS1 disposed on one side of the second direction DR2 and extending in the first direction DR1, a second long side LS2 disposed on the other side of the second direction DR2 and extending in the first direction DR1, and a second short side SS2 disposed on one side of the first direction DR1 and extending in the second direction DR2.

In an embodiment, corners between the first short side SS1 and the first and second long sides LS1 and LS2 may form a right angle, and corners between the second short side SS2 and the first and second long sides LS1 and LS2 may form a right angle. However, without being limited thereto, each corner may form an acute angle or an obtuse angle, or may have a curved portion.

The display panel DP may further include a first protruding edge PS1 disposed on one side of the second direction DR2 of the bending region BD and the sub-region SR and extending along the first direction DR1, a second protruding edge PS2 disposed on the other side of the second direction DR2 of the bending region BD and the sub-region SR and extending along the first direction DR1, and a third protruding edge PS3 disposed on one side of the first direction DR1 of the sub-region SR and extending along the second direction DR2.

In an embodiment, a corner between the first protruding edge PS1 and the second short side SS2 and a corner between the second protruding edge PS2 and the second short side SS2 may form a right angle. However, the present disclosure is not limited thereto, and the corners therebetween may have an acute angle, an obtuse angle or a curved portion. In an embodiment, a corner between the first protruding edge PS1 and the third protruding edge PS3 and a corner between the second protruding edge PS2 and the third protruding edge PS3 may form a right angle. However, the present disclosure is not limited thereto, and the corners therebetween may have an acute angle, an obtuse angle, or a curved portion.

A driving chip IC may be disposed on the sub-region SR of the display panel DP. The driving chip IC may include an integrated circuit for driving the display panel DP. In an embodiment, the integrated circuit may be, but is not limited to, a data driving integrated circuit that generates and provides a data signal. In an embodiment, the driving chip IC may be attached onto the display panel DP through an anisotropic conductive film or through ultrasonic bonding.

A pad portion may be provided at an end of the sub-region SR of the display panel DP, and a printed circuit board FPCB may be connected to the pad portion. In an embodiment, the printed circuit board FPCB may be a flexible printed circuit board or film.

The first short side SS1, the second short side SS2, the first long side LS1, the second long side LS2, the first protruding edge PS1, the second protruding edge PS2, and the third protruding edge PS3 of the display panel DP may be lines that are cut to form the display panel DP. The external appearance of the display panel DP in a plan view may be defined by the first short side SS1, the second short side SS2, the first long side LS1, the second long side LS2, the first protruding edge PS1, the second protruding edge PS2, and the third protruding edge PS3, and may have a closed curve shape.

For example, the display panel DP may be manufactured by directly cutting a mother substrate. However, without being limited thereto, the display panel DP may be manufactured by cutting a cell substrate from a mother substrate and then accurately cutting the cell substrate. At this time, the cutting process of forming a cell substrate from a mother substrate may be performed using a laser apparatus that is less precise than a laser apparatus used for the cutting process of forming the external appearance of the display panel DP. In an embodiment, in the process of forming the display panel DP from the cell substrate, the display panel DP may be formed by cutting the cell substrate along edges corresponding to the first short side SS1, the second short side SS2, the first long side LS1, the second long side LS2, the first protruding edge PS1, the second protruding edge PS2, and the third protruding edge PS3 of the display panel DP. However, the present disclosure is not limited thereto, and the display panel DP may be formed by cutting only a part of the edges. For example, the display panel DP may be formed by cutting the cell substrate along the edges corresponding to the second short side SS2, the first protruding edge PS1, and the second protruding edge PS2. In the following description, the case in which the display panel DP is manufactured by cutting a cell substrate from a mother substrate and then accurately cutting the cell substrate will be described. However, the present disclosure is not limited thereto.

The display panel DP may have a structure in which various organic layers and inorganic layers are stacked on an insulating substrate. In an embodiment, the insulating substrate may be a flexible substrate containing a polymer material. However, the present disclosure is not limited thereto, and the insulating substrate may be a glass substrate containing glass. The display panel DP may be manufactured by cutting an insulating substrate to form an external appearance of the display panel DP and then stacking various organic layers and inorganic layers. In an embodiment, a target substrate 10 (see FIG. 3) to be cut may be an insulating substrate. In this case, the display panel DP may be manufactured by stacking various organic layers (not shown) and inorganic layers (not shown) on the cut target substrate. However, the target substrate to be cut is not limited thereto, and may be a substrate in which various organic layers and inorganic layers are stacked. That is, various organic layers and inorganic layers may be stacked on the insulating substrate, and, then, the insulating substrate may be cut to form the external appearance of the display panel DP.

Figure 3:
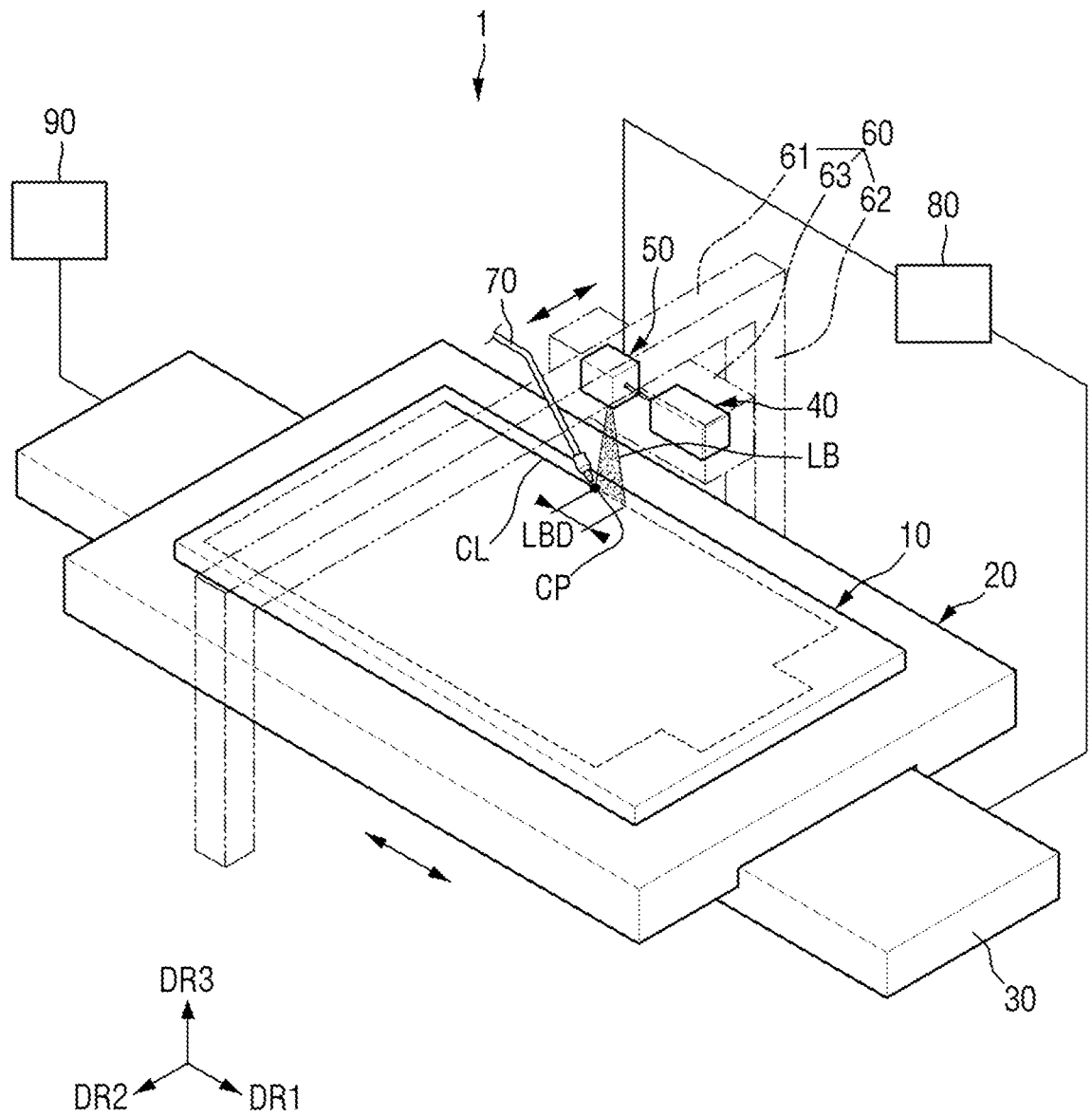
FIG. 3 is a perspective view of a laser apparatus according to an embodiment.

The cutting of the display panel DP may be performed by a laser apparatus 1 (see FIG. 3). A further detailed description thereof will be given later with reference to FIGS. 3 and 4.

A process of attaching the driving chip IC and the printed circuit board FPCB on the display panel DP and a bending process in the bending region BD of the display panel DP may be performed after the cutting process.

Herein, a laser apparatus will be described. The laser apparatus to be described below may be used for manufacturing the display panel DP by cutting a cell substrate obtained by dividing a mother substrate.

Figure 4:
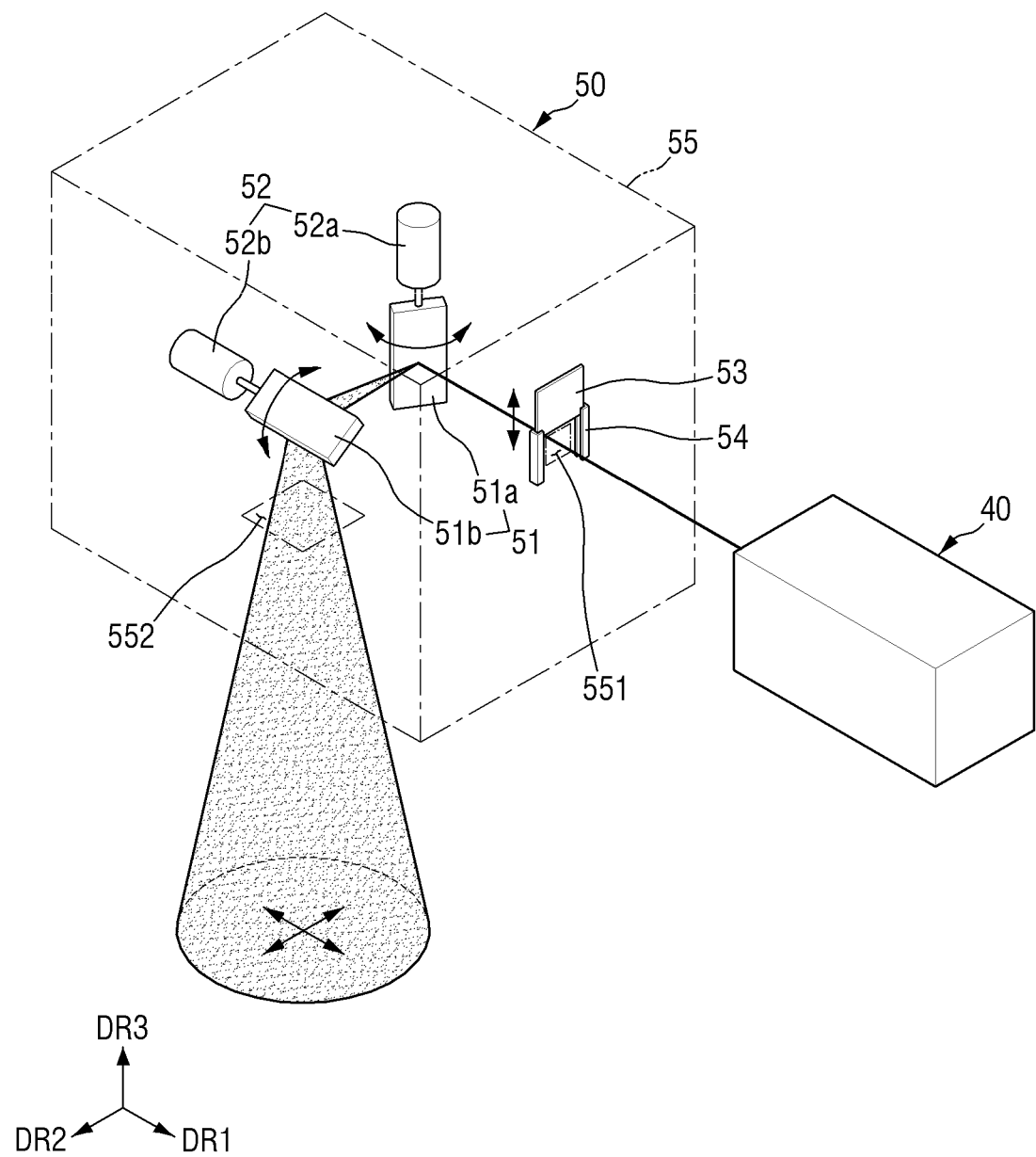
FIG. 4 is a schematic view of a scanner according to an embodiment.

FIG. 3 is a perspective view of a laser apparatus according to an embodiment; and FIG. 4 is a schematic view of a scanner according to an embodiment.

Referring to FIGS. 3 and 4, the laser apparatus 1 according to an embodiment draws or provides a laser beam LB along an imaginary cutting line CL formed on a target substrate 10 to separate and cut one side and the other side with respect to the cutting line CL. Processed lines among the cutting line CL are indicated by solid lines, and lines to be processed are indicated by dotted lines.

In an embodiment, the laser apparatus 1 may include a stage 20 on which the target substrate 10 is placed, a stage transfer unit 30 for moving the stage 20, a laser providing unit 40 for generating the laser beam LB, a scanner 50 for changing a path of the laser beam LB, a scanner transfer unit 60 for moving the scanner 50, a cooling unit 70 for cooling the target substrate 10, a control unit 80 for controlling an operation of the laser apparatus 1, and a stage encoder 90 for providing position information of the stage 20 to the control unit 80.

The stage 20 may support the target substrate 10. The stage transfer unit 30 may move the stage 20. For example, the stage transfer unit 30 may move the stage 20 in the first direction DR1. However, the present disclosure is not limited thereto, and the stage transfer unit 30 may move the stage 20 in any of various directions. The stage transfer unit 30 may move the stage 20 to move the laser beam LB along the cutting line CL. However, without being limited thereto, the stage transfer unit 30 may move, instead of or in addition to the stage 20, the laser providing unit 40 and the scanner 50 to be described later to move the laser beam LB along the cutting line CL, or may move the laser providing unit 40 and the scanner 50 at the same time to move the laser beam LB along the cutting line CL.

The laser providing unit 40 may generate and emit the laser beam LB. The laser beam LB generated by the laser providing unit 40 may be one of, for example, a $CO_2$ laser, a green laser, an infrared laser, and an ultraviolet laser, but is not limited thereto.

The scanner 50 may be disposed on an optical path of the laser beam LB emitted from the laser providing unit 40. The laser beam LB emitted from the laser providing unit 40 may enter the scanner 50. The scanner 50 may adjust an optical path of the laser beam LB emitted from the laser providing unit 40. The laser beam LB of which the optical path is adjusted by the scanner 50 may be irradiated along the cutting line CL of the target substrate 10. The scanner 50 may swing the laser beam LB. Therefore, an incidence angle of the laser beam LB on a top surface of the target substrate 10 may be changed within a range (e.g., a predetermined range). A range (e.g., a predetermined range) in which the laser beam LB is incident on the top surface of the target substrate 10 may be a light irradiation section LBD. The light irradiation section LBD may be formed along the cutting line CL.

In an embodiment, the scanner 50 may include a mirror unit 51 for reflecting the laser beam LB emitted from the laser providing unit 40, a mirror driving unit 52 for driving the mirror unit 51, a shutter 53 for blocking the laser beam LB, and a shutter driving unit 54 for driving the shutter 53.

The mirror unit 51 may swing the laser beam LB emitted from the laser providing unit 40 to move a target aiming point of the laser beam LB forward and backward. The mirror unit 51 may include a first mirror unit 51*a* for swinging the laser beam LB in the first direction DR1 and a second mirror unit 51*b* for swinging the laser beam LB in the second direction DR2. The laser beam LB may be irradiated on a plane defined by the first direction DR1 and the second direction DR2 through the first mirror unit 51*a* and the second mirror unit 51*b*.

The mirror driving unit 52 may drive the mirror unit 51 and selectively adjust the movement of the mirror unit 51. The mirror driving unit 52 may include a first mirror driving unit 52*a* for driving the first mirror unit 51*a* and a second mirror driving unit 52*b* for driving the second mirror unit 51*b*.

The shutter 53 may block the laser beam LB emitted from the laser providing unit 40. The shutter 53 may be disposed on the optical path of the laser beam LB. The shutter 53 may control the laser beam LB entering the scanner 50 through an opening/closing operation. For example, when the shutter 53 is opened, the laser beam LB may enter the scanner 50, and when the shutter 53 is closed, the laser beam LB may not enter the scanner 50. The shutter 53 may be opened/closed in a sliding manner, for example. However, the present disclosure is not limited thereto, and the shutter 53 may be opened/closed in any of various manners. Although FIG. 4 illustrates that the shutter 53 is disposed on a surface of a housing 55 of the scanner 50 to be described later, the present disclosure is not limited thereto, and the shutter 53 may be disposed inside or outside the housing 55.

The opening/closing operation of the shutter 53 may be controlled by the control unit 80. Whether to open or close the shutter 53 may be determined based on a position of a target aiming point of the laser beam LB in the target substrate 10. The target aiming point of the laser beam LB may mean a point where the laser beam LB reaches when the shutter 53 is opened. As will be described later, the position of the target aiming point of the laser beam LB in the target substrate 10 where the shutter 53 is opened/closed may be determined by a shape of the cutting line CL, a unit forward moving distance d1 (see FIG. 10) of the laser beam LB and a number of scans of the laser beam LB per unit area.

The shutter 53 may be driven by the shutter driving unit 54. As described above, in an embodiment, the shutter 53 may be opened/closed in a sliding manner, and the shutter driving unit 54 may drive the sliding of the shutter 53. The shutter driving unit 54 may be controlled by the control unit 80. The shutter driving unit 54 may receive a control signal for the shutter 53 from the control unit 80 and open/close the shutter 53. The opening/closing operation of the shutter 53 by the control unit 80 will be described further later.

The scanner 50 may further include the housing 55 for accommodating the mirror unit 51 and the mirror driving unit 52. The housing 55 may form an outer shape of the scanner 50 and may provide a space for accommodating the mirror unit 51 and the mirror driving unit 52. The housing 55 may include a light inlet port 551 that is opened on the laser providing unit 40 side to allow the laser beam LB emitted from the laser providing unit 40 to enter the housing 55, and a light irradiation port 552 that is opened to irradiate the laser beam LB toward the target substrate 10 through the mirror unit 51.

In an embodiment, the laser providing unit 40 and the scanner 50 may be moved in the second direction DR2 by the scanner transfer unit 60. In an embodiment, the scanner transfer unit 60 may have a gantry structure. The scanner transfer unit 60 may include a horizontal supporting part 61 extending in a horizontal direction, a vertical supporting part 62 connected to the horizontal supporting part 61 and extending in a third direction DR3, and a horizontal moving part 63 installed on the horizontal supporting part 61 and configured to move the laser providing unit 40 and the scanner 50 in the second direction DR2. The horizontal supporting part 61 may have a shape extended in the second direction DR2. The vertical supporting part 62 may be disposed on a first side and a second side of the stage 20 in the second direction DR2. The laser providing unit 40 and the scanner 50 may be disposed inside the horizontal moving part 63. The scanner transfer unit 60 may be connected to the control unit 80, and the movement of the scanner transfer unit 60 may be controlled by the control unit 80.

The cooling unit 70 may cool the target substrate 10 to which the laser beam LB is irradiated. In an embodiment, the cooling unit 70 may cool a rear part of the light irradiation section LBD with respect to the moving direction of the light irradiation section LBD. When the laser beam LB is irradiated on the target substrate 10, the light irradiation section LBD to which the laser beam LB is irradiated may be heated (e.g., instantaneously heated). At this time, compressive stress due to heat may occur at the light irradiation section LBD of the target substrate 10. The cooling unit 70 may cool (e.g., instantaneously cool) a rear edge of the light irradiation section LBD with respect to the moving direction of the light irradiation section LBD. At this time, tensile stress may occur at the cooled portion. When thermal shock (compressive stress and tensile stress) due to such a rapid temperature change is applied to the target substrate 10, fine cracks may be generated. Accordingly, the target substrate 10 may be cut along the cutting line CL. The degree of cooling of the target substrate 10 by the cooling unit 70 may be adjusted depending on a material of the target substrate 10 and a type of the laser beam LB.

The control unit 80 may control an overall operation of the laser apparatus 1. In an embodiment, the control unit 80 may control the stage transfer unit 30, the laser providing unit 40, the scanner 50, the scanner transfer unit 60, and the cooling unit 70. The control unit 80 may control the cutting process of the target substrate 10 using information such as the shape of the cutting line CL, a thickness and a material of the target substrate 10, the position of the stage 20, and the like.

Further, the control unit 80 may control the opening/closing operation of the shutter 53 by controlling the shutter driving unit 54. In an embodiment, the control unit 80 may control the shutter 53 to be closed when the target aiming point of the laser beam LB is located in a non-processing area NPA (see FIG. 10), and, when the target aiming point of the laser beam LB is located in a processing area PA (see FIG. 10), the shutter 53 may be controlled to be opened if the moving speed of the target aiming point of the laser beam LB is higher than or equal to a reference speed and may be controlled to be closed if the moving speed thereof is lower than the reference speed. The reference speed is set to uniformly (uniformly or substantially uniformly) irradiate the laser beam LB to each section of the cutting line CL, and may be lower than or equal to a moving speed of the laser beam LB irradiated on the target substrate 10.

The cutting process using the laser irradiation may include a first period in which the shutter 53 is opened and a second period in which the shutter 53 is closed. The control unit 80 may control the shutter driving unit 54 to open the shutter 53 during the first period and to close the shutter 53 during the second period. During the first period, the target aiming point of the laser beam LB may be located in the processing area, and the moving speed of the target aiming point of the laser beam LB may be higher than or equal to the reference speed. During the second period, the target aiming point of the laser beam LB may be located in the non-processing area or in the processing area, and the moving speed thereof may be lower than the reference speed.

The control of the shutter 53 by the control unit 80 will be described in further detail later.

The stage encoder 90 may provide position information of the stage 20 to the control unit 80. In an embodiment, the stage encoder 90 may detect the position of the stage 20, convert the detected position into an electric signal, and provide the electric signal to the control unit 80.

In the process of cutting the target substrate 10 using the laser beam LB, the laser beam LB is swung by the mirror unit 51. At the same time, the scanner 50 may be moved by the scanner transfer unit 60, and the stage 20 may be moved by the stage transfer unit 30. The above-described operations allow the laser beam LB to repeat forward movement in the moving direction of the light irradiation section LBD and backward movement in a direction opposite to the moving direction of the light irradiation section LBD. In an embodiment, the forward moving distance of the laser beam LB may be greater than the backward moving distance thereof. Therefore, the light irradiation section LBD may be moved while repeating the forward movement and the backward movement of the laser beam LB. For example, during the cutting process, when the light irradiation section LBD is moved toward one side of the first direction DR1, the movement of the laser beam LB toward one side of the first direction DR1 may be the forward movement, and the movement of the laser beam LB toward the other side of the first direction DR1 may be the backward movement.

The laser beam LB may provide energy to the cutting line CL of the target substrate 10 while moving forward and backward along the cutting line CL. A spot where the laser beam LB is irradiated (e.g., instantaneously irradiated) may be moved forward and backward along the cutting line CL to provide energy to the cutting line CL of the target substrate 10. The irradiation spots per unit area in the cutting line CL may be uniform overall, but the present disclosure is not limited thereto. The target substrate 10 may be cut along the cutting line CL by the energy provided by the laser beam LB.

Herein, a method for manufacturing a display device using the above-described laser apparatus 1 will be described. The method for manufacturing a display device DD to be described is a method for forming a display panel DP by cutting a target substrate 10 using a laser beam LB.

Figure 5:
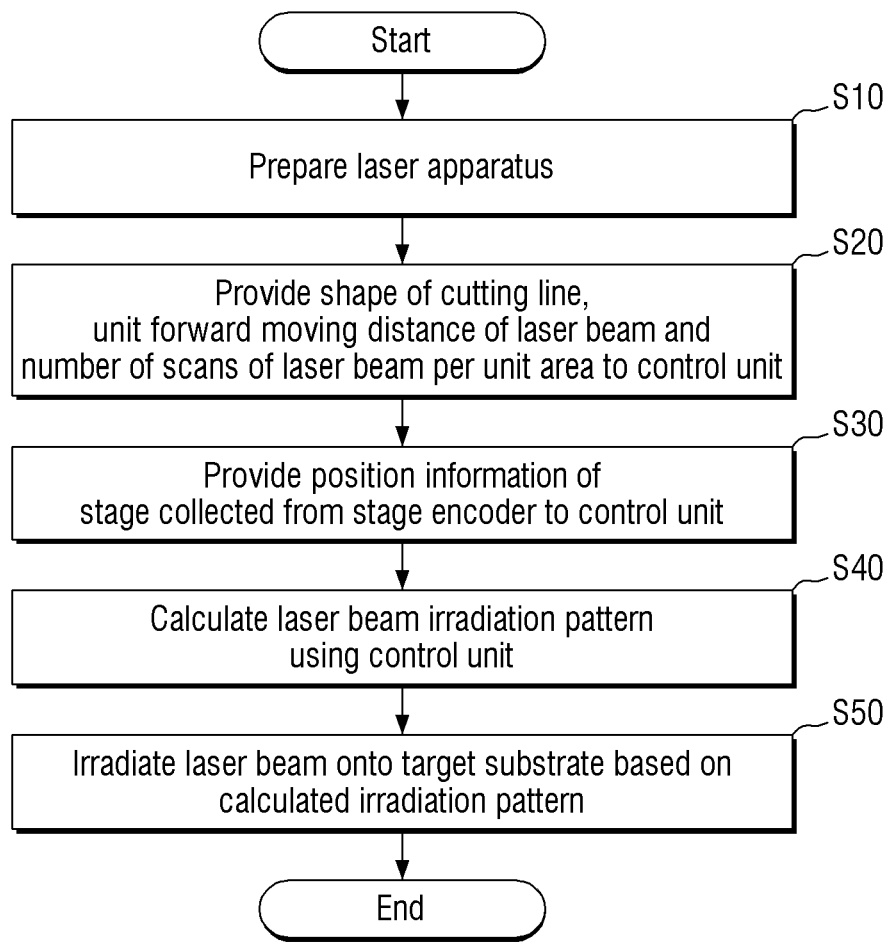
FIG. 5 is a flowchart showing a method for manufacturing a display device according to an embodiment.
Figure 6:
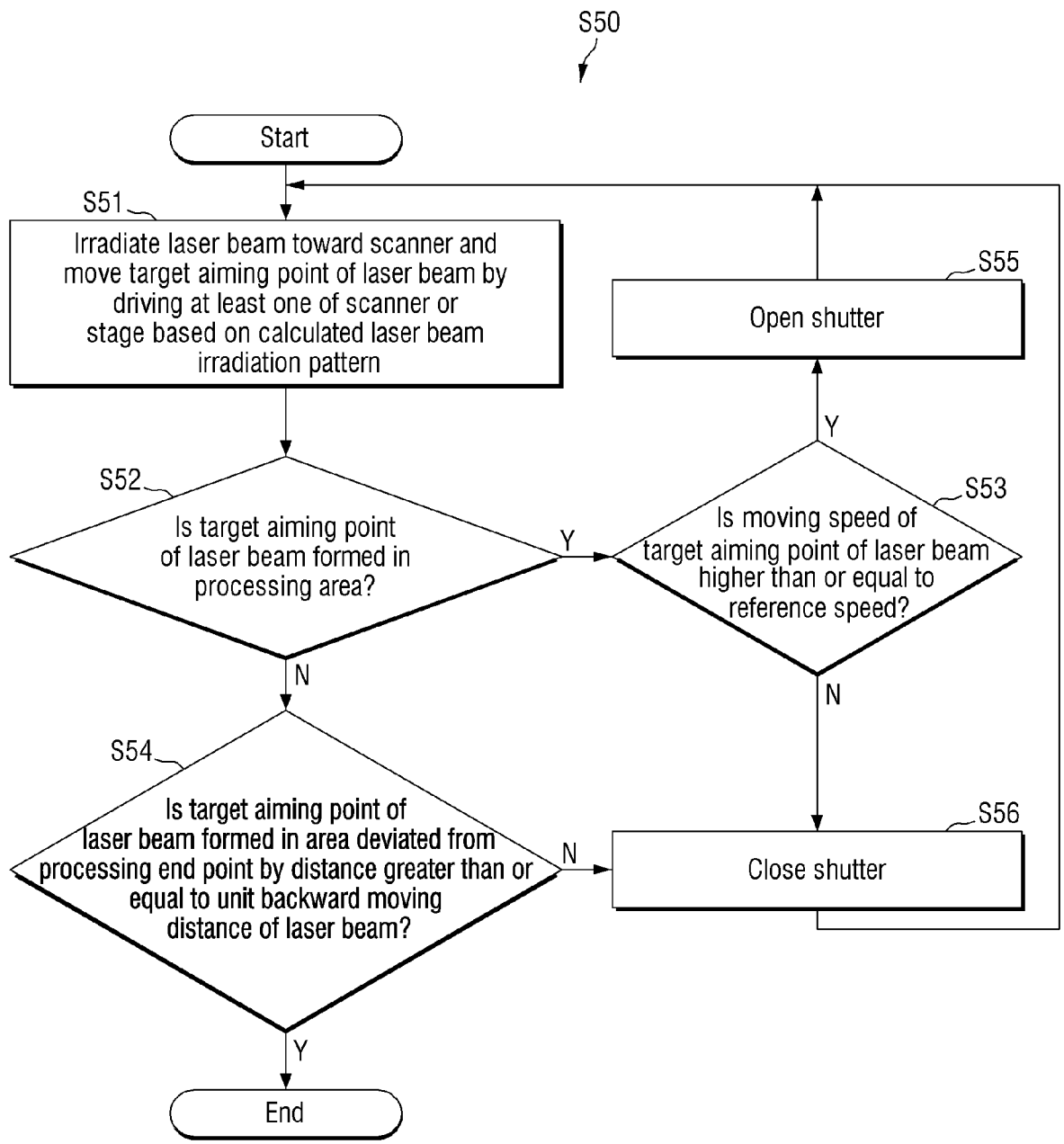
FIG. 6 is a flowchart showing steps or tasks of irradiating a laser beam on a target substrate based on a calculated irradiation pattern according to an embodiment.
Figure 7:
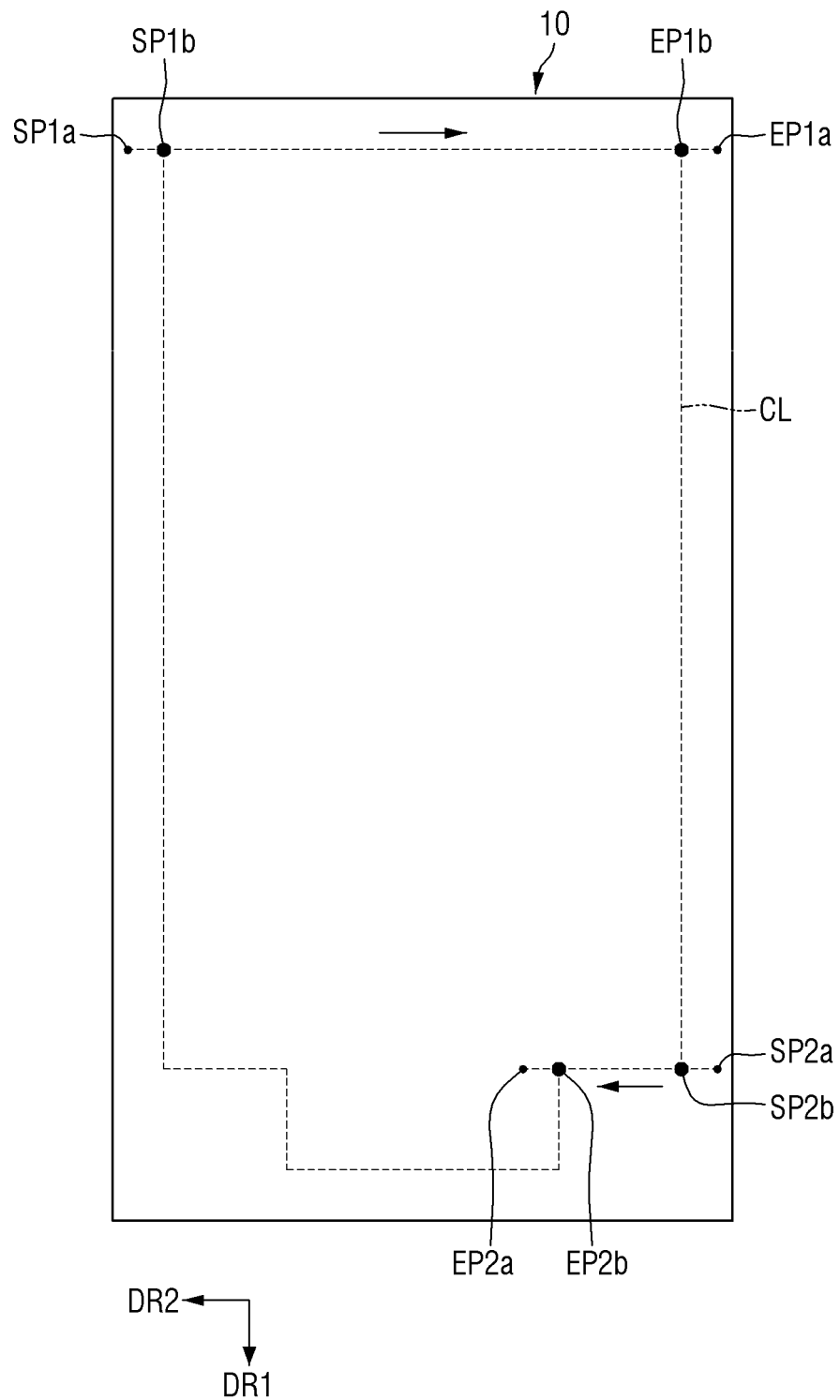
FIG. 7 is a plan view showing a target substrate to which a laser beam is irradiated by the method for manufacturing a display device of FIG. 5.
Figure 8:
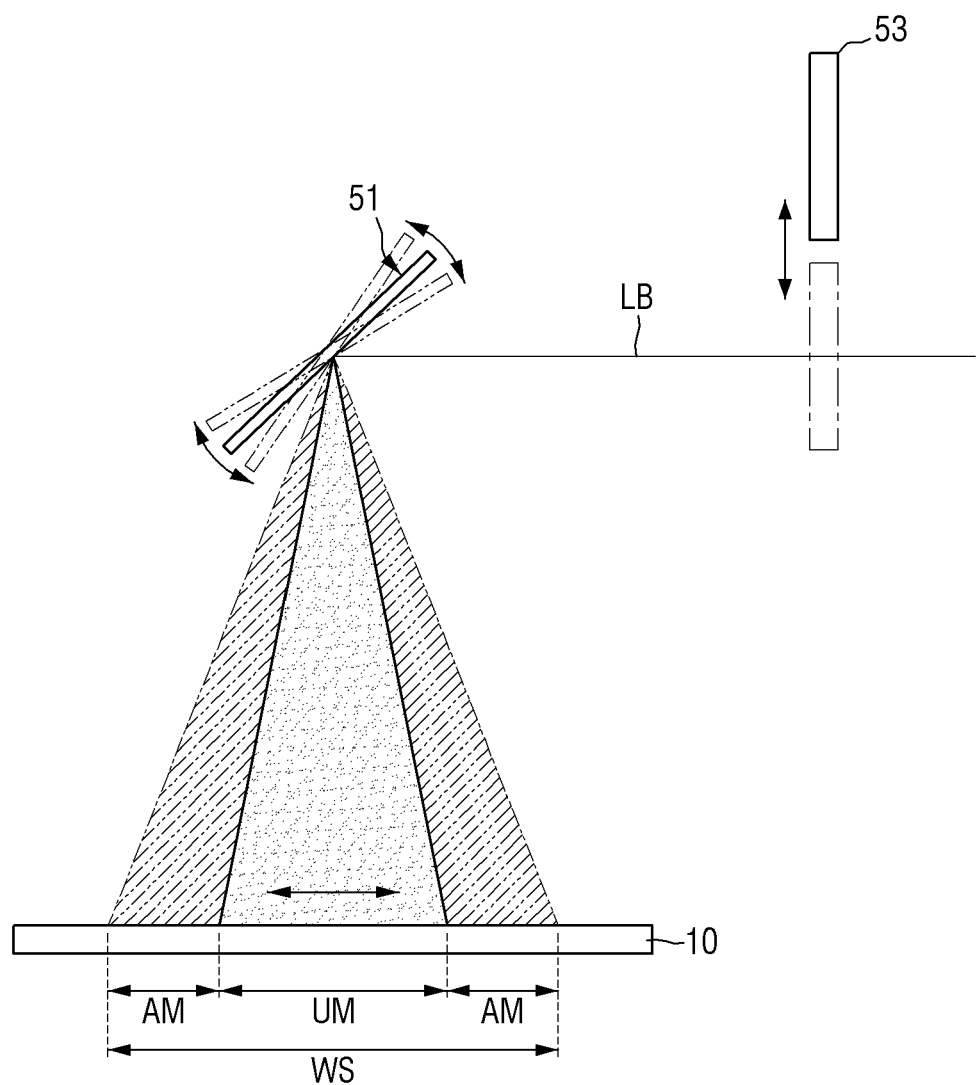
FIG. 8 shows a process of driving a mirror unit according to an embodiment.
Figure 9:
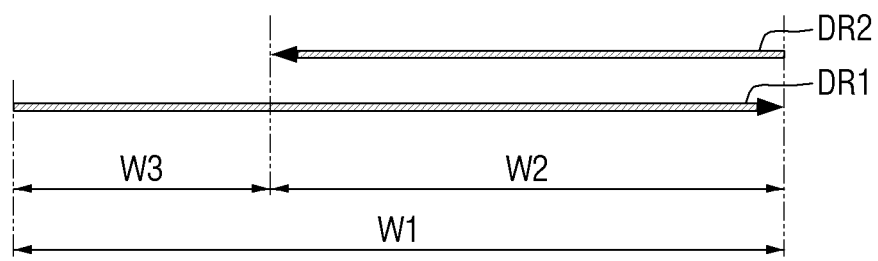
FIG. 9 shows movement of a target aiming point of a laser beam according to an embodiment.
Figure 10:
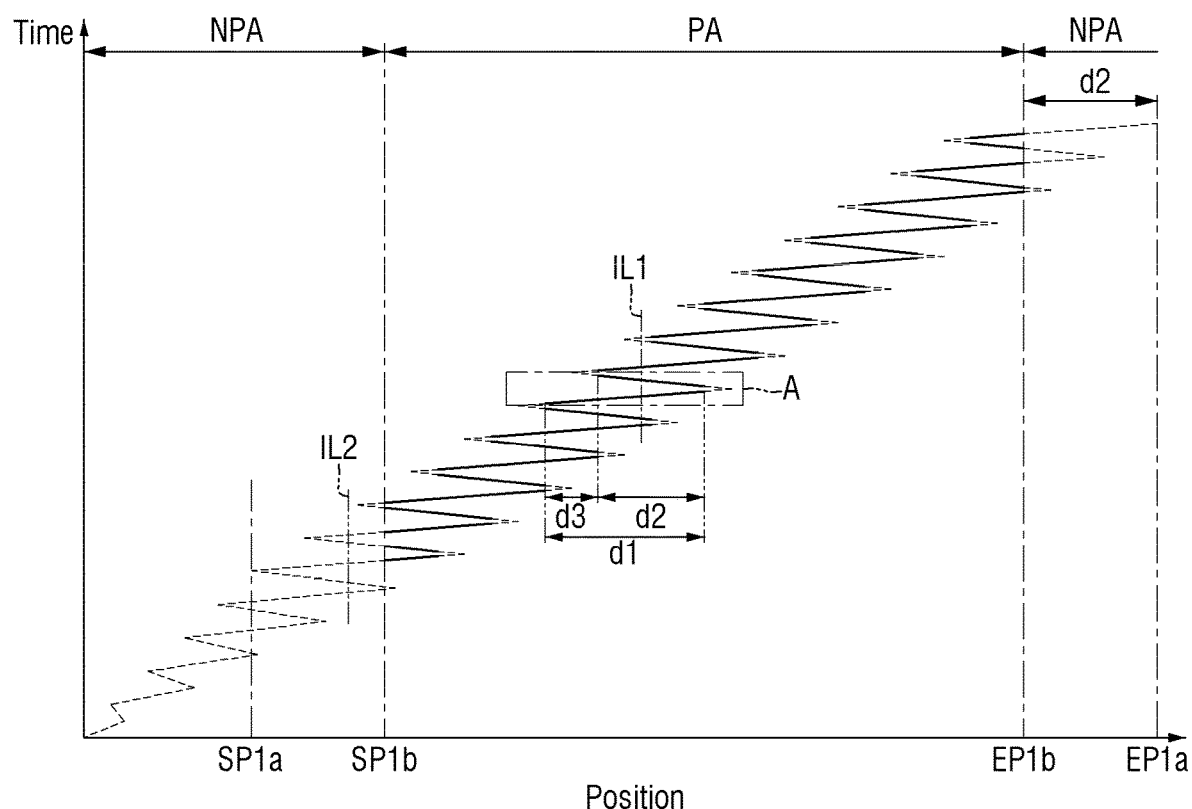
FIG. 10 is a graph showing temporal positions of the target aiming point of the laser beam at the time of irradiating the laser beam by the method for manufacturing a display device according to an embodiment.
Figure 11:
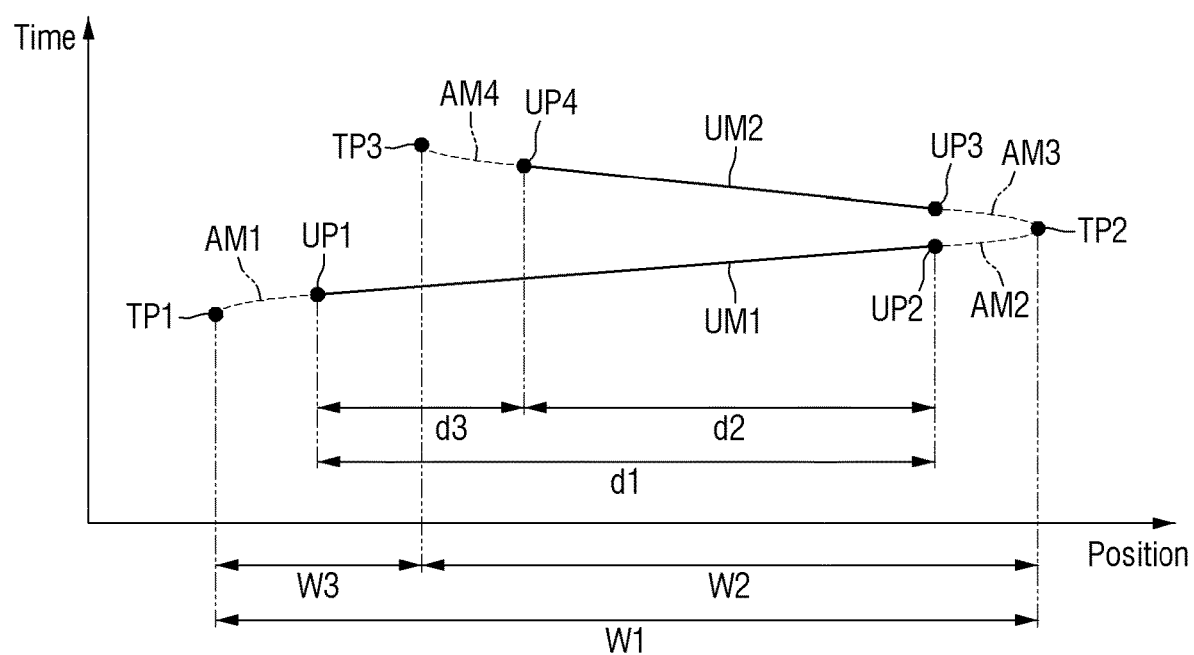
FIG. 11 is an enlarged view of a region "A" of FIG. 10.
Figure 12:
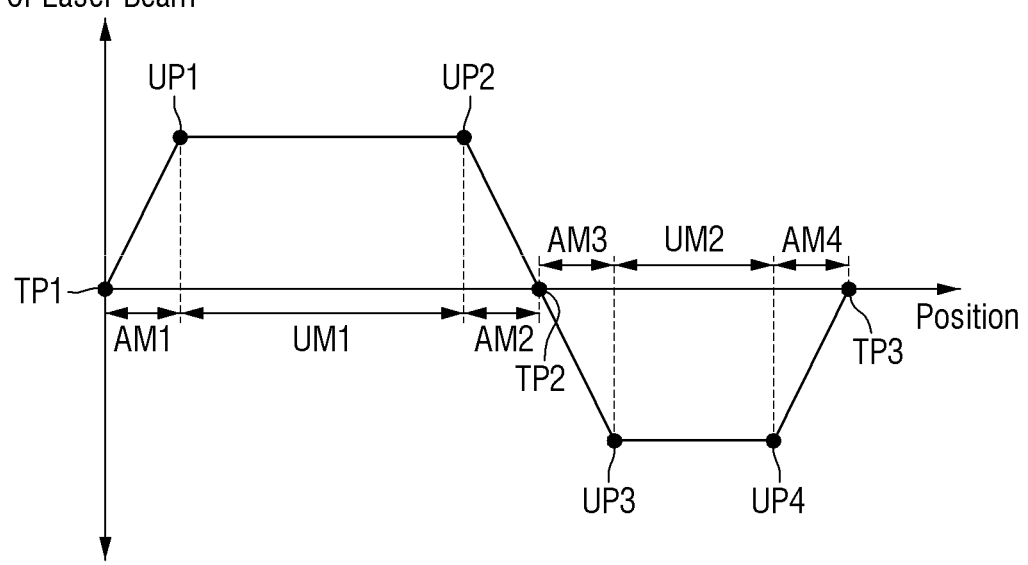
FIG. 12 is a graph showing a moving speed of the target aiming point of the laser beam with respect to the position during the swing of the laser beam irradiated by the method for manufacturing the display device according to an embodiment.

FIG. 5 is a flowchart showing a method for manufacturing a display device according to an embodiment; FIG. 6 is a flowchart showing steps or tasks of irradiating a laser beam on a target substrate based on a calculated irradiation pattern according to an embodiment; FIG. 7 is a plan view showing a target substrate to which a laser beam is irradiated by the method for manufacturing a display device of FIG. 5; FIG. 8 shows a process of driving a mirror unit according to an embodiment; FIG. 9 shows movement of a target aiming point of a laser beam according to an embodiment; FIG. 10 is a graph showing temporal positions of the target aiming point of the laser beam at the time of irradiating the laser beam by the method for manufacturing a display device according to an embodiment; FIG. 11 is an enlarged view of a region "A" of FIG. 10; and FIG. 12 is a graph showing a moving speed of the target aiming point of the laser beam with respect to the position during the swing of the laser beam irradiated by the method for manufacturing a display device according to an embodiment.

Referring to FIGS. 5 to 12, a method for manufacturing a display device according to an embodiment may include preparing a laser apparatus (S10), providing a shape of a cutting line, a unit forward moving distance of a laser beam, and a number of scans of the laser beam per unit area to a control unit (S20), providing position information of a stage collected from a stage encoder to the control unit (S30), calculating a laser beam irradiation pattern using the control unit (S40), and irradiating the laser beam onto a target substrate based on the calculated irradiation pattern (S50).

In preparing the laser apparatus (S10), the laser apparatus may be the laser apparatus 1 described above with reference to FIGS. 3 and 4. Therefore, an additional description thereof will be omitted.

After preparing the laser apparatus (S10), providing the shape of the cutting line, the unit forward moving distance of the laser beam, and the number of scans of the laser beam per unit area to the control unit 80 (S20) may be performed.

As described above, the cutting line CL may be a line along which the target substrate 10 is cut by irradiating the laser beam LB. The shape of the cutting line CL may be the same as the shape of the display panel DP described above with reference to FIG. 1.

The target aiming point of the laser beam LB may be moved generally along the cutting line CL by the operations of the scanner 50 (see FIG. 3) and the stage 20 (see FIG. 3). The target aiming point of the laser beam LB may be formed in an area outside the cutting line CL. However, in the area where the target aiming point of the laser beam LB is outside the cutting line CL, the shutter 53 may be closed and the laser beam LB may not be irradiated.

For example, the target aiming point of the laser beam LB may be moved from a first aiming start point SP1a to a first aiming end point EP1a through a first cutting start point SP1b and a first cutting end point EP1b on the target substrate 10. The area between the first cutting start point SP1b and the first cutting end point EP1b, which is the processing area PA to which the laser beam LB is irradiated, may be positioned inside the cutting line CL. The area between the first aiming start point SP1a and the first cutting start point SP1b and the area between the first cutting end point EP1b and the first aiming end point EP1a, which are the non-processing area NPA where the laser beam LB is blocked by the shutter 53 and is not irradiated on the target substrate 10, may be positioned outside the cutting line CL. The non-processing area NPA may be an area where the number of scans of the laser beam LB per unit area is made to be uniform in the area between the first cutting start point SP1b and the first cutting end point EP1b. A further detailed description of the processing area PA and non-processing area NPA will be provided later.

The target aiming point of the laser beam LB may repeat the forward movement and the backward movement as described above. When the target aiming point of the laser beam LB is moved from the first aiming start point SP1a to the first aiming end point EP1a, the laser beam LB may be continuously emitted from the laser providing unit.

A side formed by the first cutting start point SP1b and the first cutting end point EP1b may be the first short side SS1 (see FIG. 1) of the display panel DP. The first cutting start point SP1b and the first cutting end point EP1b may be positioned between the first aiming start point SP1a and the first aiming end point EP1a.

The laser beam LB may be irradiated from the first cutting start point SP1b to the first cutting end point EP1b on the target substrate 10. When the target aiming point of the laser beam LB passes through the area between the first aiming start point SP1a and the first cutting start point SP1b and the area between the first cutting end point EP1b and the first aiming end point EP1a, the shutter 53 may be closed and the laser beam LB may not be irradiated on the corresponding areas. However, even in this case, the laser beam LB may be continuously emitted from the laser providing unit 40. Without being limited thereto, when the target aiming point of the laser beam LB passes through the area between the first aiming start point SP1a and the first cutting start point SP1b and the area between the first cutting end point EP1b and the first aiming end point EP1a, the shutter 53 may be opened and the laser beam LB may be irradiated on the corresponding areas because the corresponding areas are located outside the cutting line CL.

Further, the target aiming point of the laser beam LB may be moved from a second start point SP2a to a second end point EP2a through a second cutting start point SP2b and a second cutting end point EP2b on the target substrate 10. The area between the second start point SP2a and the second cutting start point SP2b may be located outside the closed curve-shaped cutting line CL, and the area between the second cutting end point EP2b and the second end point EP2a may be located inside the closed curve-shaped cutting line CL. The target aiming point of the laser beam LB may be moved while repeating the forward movement and the backward movement as described above. When the target aiming point of the laser beam LB is moved from the second start point SP2a to the second end point EP2a, the laser beam LB may be continuously emitted from the laser providing unit.

A side formed by the second cutting start point SP2b and the second cutting end point EP2b may be the second short side SS2 (see FIG. 1) of the display panel DP. The second cutting start point SP2b and the second cutting end point EP2b may be located between the second start point SP2a and the second end point EP2a.

When the target aiming point of the laser beam LB passes through the area between the second cutting start point SP2b and the second cutting end point EP2b, which is the processing area PA, the shutter 53 may be opened and the laser beam LB may be irradiated on the corresponding area. When the target aiming point of the laser beam LB passes through the area between the second start point SP2a and the second cutting start point SP2b and the area between the second cutting end point EP2b and the second end point EP2a, which are the non-processing area NPA, the shutter 53 may be closed and the laser beam LB may not be irradiated on the corresponding areas. However, even in this case, the laser beam LB may be continuously emitted from the laser providing unit 40. Without being limited thereto, when the target aiming point of the laser beam LB passes through the area between the second start point SP2a and the second cutting start point SP2b, the shutter 53 may be opened and the laser beam LB may be irradiated on the corresponding area because the corresponding area is located outside the cutting line CL. Also, in this case, when the target aiming point of the laser beam LB passes through the area between the second cutting end point EP2b and the second end point EP2a, the shutter 53 may be closed because the corresponding area is located inside the cutting line CL.

In the process of irradiating the laser beam LB, the laser beam LB is swung by the mirror unit 51. Accordingly, the target aiming point of the laser beam LB may repeat the forward movement and the backward movement. In an embodiment, the target aiming point of the laser beam LB may swing with a fixed swing width WS. When the target aiming point of the laser beam LB is moved forward and backward, uniform motion UM in which a moving speed is constant and accelerating/decelerating motion AM in which a moving speed changes may be carried out.

When the target aiming point of the laser beam LB is moved in the uniform motion UM, the shutter 53 may be opened and the laser beam LB may be irradiated on the target substrate 10. When the target aiming point of the laser beam LB is moved in the accelerating/decelerating motion AM, the shutter 53 may be closed and the laser beam LB may not be irradiated on the target substrate 10. However, even in this case, the laser beam LB may be continuously emitted from the laser providing unit 40.

The cutting process may be performed by the swing of the laser beam LB and the movement of the stage 20 and/or the scanner 50. For example, the target aiming point of the laser beam LB may repeat the forward movement in the first direction DR1 and the backward movement in the second direction DR2. At the same time, the movement of the stage 20 in the second direction DR2 and/or the movement of the scanner 50 in the first direction DR1 may be carried out.

A unit forward moving distance W1 of the target aiming point of the laser beam LB may be the same as the sum of the swing width WS of the target aiming point of the laser beam LB during one swing of the laser beam LB and the moving distance of the stage 20 or the scanner 50 during one swing of the laser beam LB. A unit backward moving distance W2 of the target aiming point of the laser beam LB may be the same as a value obtained by subtracting the moving distance of the stage 20 or the scanner 50 during one swing of the laser beam LB from the swing width WS of the target aiming point of the laser beam LB during one swing of the laser beam LB. The unit backward moving distance W2 of the target aiming point of the laser beam LB may be smaller than the unit forward moving distance W1 of the target aiming point of the laser beam LB.

Due to the swing of the laser beam LB and the movement of the stage 20 and/or the scanner 50, the target aiming point of the laser beam LB may be moved forward by a unit moving distance W3 whenever it is moved forward and backward. The unit moving distance W3 of the target aiming point of the laser beam LB may be the same as a value obtained by subtracting the unit backward moving distance W2 of the target aiming point of the laser beam LB from the unit forward moving distance W1 of the target aiming point of the laser beam LB.

A unit forward moving distance d1 of the laser beam LB may mean the forward moving distance of the laser beam LB in each uniform motion UM. A unit backward moving distance d2 of the laser beam LB may mean the backward moving distance of the laser beam LB in each uniform motion UM. The unit forward moving distance d1 of the laser beam LB may be greater than the unit backward moving distance d2. In the uniform motion UM of the laser beam LB, the unit forward moving distance d1 and the unit backward moving distance d2 of the laser beam LB may be constant, but the present disclosure is not limited thereto.

A number (n) of scans of the laser beam LB per unit area may mean the number of scans of the laser beam LB at any point in the cutting line CL. The number (n) of scans of the laser beam LB per unit area may be uniform for the entire cutting line CL. In other words, uniform energy may be applied to the entire cutting line CL in the process of irradiating the laser beam LB.

The unit forward moving distance d1 of the laser beam LB and the number (n) of scans of the laser beam LB per unit area may be differently set depending on the target substrate 10. For example, they may be differently set depending on the shape, the thickness, and the material of the target substrate 10, but the present disclosure is not limited thereto.

When the unit forward moving distance d1 of the laser beam LB and the number (n) of scans of the laser beam LB per unit area are determined, the unit moving distance d3 of the laser beam LB may be determined by the following Equation 1:

$$d3 = \frac{2d1}{n}. \qquad \text{Equation 1}$$

The unit moving distance d3 of the laser beam LB may mean a moving distance of the laser beam LB irradiated on the target substrate 10 for each swing of the laser beam LB through the mirror unit 51. The unit moving distance d3 of the laser beam LB may be the same as a difference between the unit forward moving distance d1 and the unit backward moving distance d2 of the laser beam LB. Therefore, when the unit forward moving distance d1 of the laser beam LB and the number (n) of scans of the laser beam LB per unit area are determined, the unit backward moving distance d2 and the unit moving distance d3 of the laser beam LB may also be determined.

After providing the shape of the cutting line, the unit forward moving distance of the laser beam, and the number of scans of the laser beam per unit area to the control unit (S20), providing the position information of the stage collected from the stage encoder to the control unit (S30) may be performed. As described above with reference to FIGS. 3 and 4, the stage encoder 90 may provide the position of the stage 20. The position where the target substrate 10 is placed on the stage 20 may be substantially constant. Therefore, by providing the position information of the stage 20, it is possible to provide a specific position of the target substrate 10 on the stage 20 to the control unit 80.

In an embodiment, providing the position information of the stage collected from the stage encoder to the control unit (S30) may be performed before providing the shape of the cutting line, the unit forward moving distance of the laser beam, and the number of scans of the laser beam per unit area to the control unit (S20). In other words, the execution sequence of providing the position information of the stage collected from the stage encoder to the control unit (S30) and providing the shape of the cutting line, the unit forward moving distance of the laser beam, and the number of scans of the laser beam per unit area to the control unit (S20) is not limited.

After providing the position information of the stage collected from the stage encoder to the control unit (S30), calculating the irradiation pattern of the laser beam using the control unit (S40) may be performed. The irradiation pattern of the laser beam LB may be calculated based on the information provided at S30 described above, such as the shape of the cutting line CL, the unit forward moving distance d1 of the laser beam LB, the number (n) of scans of the laser beam LB per unit area, the position of the stage 20 collected from the stage encoder 90, and the like. The calculated irradiation pattern of the laser beam LB may include, for example, the unit moving distance d3 of the laser beam LB calculated by Equation 1 above, the first aiming start point SP1a and the first aiming end point EP1a determined by the position information of the stage 20 provided from the stage encoder 90, operation/non-operation of the shutter 53 depending on positions, a laser beam switching point, and the like. In other words, when the irradiation pattern of the laser beam LB is calculated, the cutting line CL of the laser beam LB irradiated on the target substrate 10, the first aiming start point SP1a, the first aiming end point EP1a, the laser beam switching point, the unit forward moving distance d1 of the laser beam LB, the unit moving distance d3 of the laser beam LB, the moving speed of the target aiming point of the laser beam LB, and the like may be determined.

After calculating the irradiation pattern of the laser beam using the control unit (S40), irradiating the laser beam onto the target substrate based on the calculated irradiation pattern (S50) may be performed. The laser beam LB may be irradiated along the cutting line CL such that the number (n) of scans of the laser beam LB per unit area becomes constant. Further, when the target aiming point of the laser beam LB is moved along the cutting line CL, the unit forward moving distance d1 of the laser beam LB, the unit backward moving distance d2 of the laser beam LB, and the unit moving distance d3 of the laser beam LB may be maintained at constant values.

Irradiating the laser beam onto the target substrate based on the calculated irradiation pattern (S50) may include irradiating the laser beam toward the scanner and moving the target aiming point of the laser beam by driving at least one of the scanner or the stage based on the calculated laser beam irradiation pattern (S51), determining whether or not the laser beam is irradiated in the processing area (S52), determining whether or not the moving speed of the laser beam is higher than or equal to the reference speed when the laser beam is irradiated in the processing area (S53), and determining, when the laser beam is not irradiated in the processing area, whether or not the laser beam is irradiated to an area deviated from the first cutting end point by a distance greater than or equal to the unit backward moving distance of the laser beam (S54).

The laser providing unit 40 may irradiate the laser beam LB toward the scanner 50. The target aiming point of the laser beam LB may be moved in the uniform motion UM in the light irradiation section LBD by the scanner 50. At the same time, the laser beam LB moving in the uniform motion UM in the light irradiation section LBD may move at least one of the scanner 50 or the stage 20 to move the target aiming point of the laser beam LB along the cutting line CL. In other words, the target aiming point of the light irradiation section LBD may be moved along the cutting line CL. The shutter 53 may operate through several determination steps in real time while the target aiming point of the laser beam LB is moved. When the shutter 53 is opened, the laser beam LB enters the scanner 50 from the laser providing unit 40. When the shutter 53 is closed, the laser beam LB from the laser providing unit 40 may be blocked from entering the scanner 50.

The following is a description of several determination steps performed to determine whether to open or close the shutter 53 during the movement of the target aiming point of the laser beam LB in irradiating the laser beam onto the target substrate based on the calculated irradiation pattern (S50). First, determining whether or not the target aiming point of the laser beam is formed in the processing area (S52) may be performed. The processing area PA may mean an area where the target substrate 10 is cut by the laser beam LB. The processing area PA may be an area between the first cutting start point SP1b and the first cutting end point EP1b formed along the cutting line CL. The non-processing area NPA may mean an area except the processing area PA.

The laser beam LB may be irradiated from the laser providing unit 40 toward the scanner 50 before the target aiming point reaches the first cutting start point SP1b. In other words, the laser beam LB may be emitted toward the scanner 50 when the target aiming point is located in the non-processing area NPA before reaching the first cutting start point SP1b. The laser beam LB may be swung by the swing of the mirror unit 51. The mirror unit 51 may be changed from a stopped state to a state of swinging at a constant speed by accelerating a swing speed. When the mirror unit 51 swings at a constant speed, the target aiming point of the laser beam LB may repeat the forward movement and the backward movement with a constant swing width WS. The mirror unit 51 may be accelerated by moving at least one of the stage 20 or the scanner 50. However, the present disclosure is not limited thereto, and the acceleration of the mirror unit 51 may be performed in a state in which the stage 20 and the scanner 50 are stopped. The point at which the mirror unit 51 starts the uniform motion UM may be the first aiming start point SP1a. When the target aiming point of the laser beam LB reaches the first aiming start point SP1a, the laser beam LB may be emitted from the laser providing unit 40. However, without being limited thereto, the laser beam LB may be emitted before the target aiming point of the laser beam LB reaches the first aiming start point SP1a. By securing the area between the first aiming start point SP1a and the first cutting start point SP1b, the number of scans of the irradiated laser beam LB per unit area may be the same in the processing area PA between the first cutting start point SP1b and the first cutting end point EP1b.

Further, the laser beam LB may be emitted toward the scanner 50 until the target aiming point of the laser beam LB is located at the first aiming end point EP1a even after passing through the first cutting end point EP1b. In other words, the laser beam LB may be continuously emitted even when the target aiming point is located in the non-processing area NPA between the first cutting end point EP1b and the first aiming end point EP1a. The distance between the first cutting end point EP1b and the first aiming end point EP1a may be the same as the unit backward moving distance d2 of the laser beam LB, but the present disclosure is not limited thereto.

When a first imaginary line IL1 parallel to a time axis is drawn at any point in the processing area PA, the number of intersection points where the first imaginary line IL1 and the graph intersect may be constant. Therefore, the number (n) of scans of the laser beam LB per unit area at any point in the processing area PA may be uniform, and the number (n) of scans of the laser beam LB per unit area may be uniform. For example, in FIG. 10, the number of intersection points where the graph intersects the first imaginary line IL1 drawn at any point in the processing area PA may be 5 (n=5), and the number of intersection points where the graph intersects a second imaginary line IL2 may be 3 smaller than 5.

In the graph of FIG. 10, the target aiming point of the laser beam LB when the shutter 53 is closed is indicated by a dotted line, and the target aiming point of the laser beam LB when the shutter 53 is opened is indicated by a solid line. When the target aiming point of the laser beam LB is located in the non-processing area NPA, the shutter 53 may be closed and the irradiation of the laser beam LB on the target substrate 10 may be blocked. Further, it is determined whether or not the target aiming point of the laser beam LB is formed in an area deviated from the first cutting end point EP1b by a distance greater than or equal to the unit backward moving distance d2 of the laser beam LB. When the target aiming point of the laser beam LB is formed in an area deviated from the first cutting end point EP1b by the distance greater than or equal to the unit backward moving distance d2 of the laser beam LB, the laser processing may be completed. The point deviated from the first cutting end point EP1*b* by the unit backward moving distance d2 of the laser beam LB may be the first aiming end point EP1*a* where the laser processing is completed.

The shutter 53 may prevent the target substrate 10 from being processed in the area other than the processing area PA. In other words, the shutter 53 may be closed when the target aiming point of the laser beam LB is located between the first aiming start point SP1*a* and the first cutting start point SP1*b* and between the first cutting end point EP1*b* and the first aiming end point EP1*a*.

When the target aiming point of the laser beam LB is located in the processing area PA, determining whether or not the moving speed of the target aiming point of the laser beam is higher than or equal to the reference speed (S53) may be performed. When the moving speed of the target aiming point of the laser beam LB is higher than or equal to the reference speed, the shutter 53 may be opened (S55) and the laser beam LB may be irradiated on the target substrate 10. When the moving speed of the target aiming point of the laser beam LB is lower than the reference speed, the shutter 53 may be closed (S56) and the laser beam LB may not be irradiated on the target substrate 10. The reference speed may be lower than or equal to the speed of the uniform motion UM of the laser beam LB. Due to the above (S53), when the target aiming point of the laser beam LB is moved in the accelerating/decelerating motion AM, the shutter 53 may be closed and the laser beam LB may not be irradiated on the target substrate 10. Therefore, the laser beam LB may be irradiated while moving along the cutting line CL on the target substrate 10 at a uniform speed.

Herein, the unit forward movement and the unit backward movement repeated during the movement of the target aiming point of the laser beam LB will be described. The target aiming point of the laser beam LB may move forward from a first aiming switching point TP1 toward a second aiming switching point TP2, and then change the direction at the second aiming switching point TP2 to move backward toward a third aiming switching point TP3.

When the target aiming point of the laser beam LB is moving forward, a first laser beam switching point UP1 and a second laser beam switching point UP2 may be located between the first aiming switching point TP1 and the second aiming switching point TP2. The first laser beam switching point UP1 and the second laser beam switching point UP2 may be boundary points at one side and the other side of a first uniform motion section UM1 in which the target aiming point of the laser beam LB is moved forward at a constant speed. In the first uniform motion section UM1 between the first laser beam switching point UP1 and the second laser beam switching point UP2, the shutter 53 may be opened and the laser beam LB may be irradiated on the target substrate 10. The first uniform motion section UM1 may be a section in which the target aiming point of the laser beam LB is moved at a constant speed higher than or equal to the reference speed.

A first accelerating/decelerating section AM1 is formed between the first aiming switching point TP1 and the first laser beam switching point UP1. In the first accelerating/decelerating section AM1, the shutter 53 may be closed and the laser beam LB may not be irradiated on the target substrate 10. The first accelerating/decelerating section AM1 may be a section in which the moving speed of the target aiming point of the laser beam LB increases.

A second accelerating/decelerating section AM2 is formed between the second laser beam switching point UP2 and the second aiming switching point TP2. In the second accelerating/decelerating section AM2, the shutter 53 may be closed and the laser beam LB may not be irradiated on the target substrate 10. The second accelerating/decelerating section AM2 may be a section in which the moving speed of the target aiming point of the laser beam LB decreases.

A third laser beam switching point UP3 and a fourth laser beam switching point UP4 may be located between the second aiming switching point TP2 and the third aiming switching point TP3. The third laser beam switching point UP3 and the fourth laser beam switching point UP4 may be boundary points at one side and the other side of a second uniform motion section UM2 in which the target aiming point of the laser beam LB is moved backward at a constant speed. In the second uniform motion section UM2 between the third laser beam switching point UP3 and the fourth laser beam switching point UP4, the shutter 53 may be opened and the laser beam LB may be irradiated on the target substrate 10. The second uniform motion section UM2 may be a section in which the target aiming point of the laser beam LB is moved at a constant speed higher than or equal to the reference speed.

In an embodiment, the third laser beam switching point UP3 may be located at the same point as the second laser beam switching point UP2, but the present disclosure is not limited thereto. The fourth laser beam switching point UP4 may be located at one side of the forward direction of the laser beam LB from the first laser beam switching point UP1. The distance between the first laser beam switching point UP1 and the fourth laser beam switching point UP4 may be the same as the unit moving distance d3 of the laser beam LB.

A third accelerating/decelerating section AM3 is formed between the second aiming switching point TP2 and the third laser beam switching point UP3. In the third accelerating/decelerating section AM3, the shutter 53 may be closed and the laser beam LB may not be irradiated on the target substrate 10. The third accelerating/decelerating section AM3 may be a section in which the moving speed of the target aiming point of the laser beam LB decreases but the absolute value of the moving speed increases.

A fourth accelerating/decelerating section AM4 is formed between the fourth laser beam switching point UP4 and the third aiming switching point TP3. In the fourth accelerating/decelerating section AM4, the shutter 53 may be closed and the laser beam LB may not be irradiated on the target substrate 10. The fourth accelerating/decelerating section AM4 may be a section in which the moving speed of the target aiming point of the laser beam LB increases and the absolute value of the moving speed increases.

In accordance with the laser apparatus 1 and the method for manufacturing the display device DD according to an embodiment, it is possible to provide uniform energy to each area along the cutting line CL. The laser beam LB may be irradiated while reciprocating along the cutting line CL. When the target aiming point of the laser beam LB is located in the non-processing area NPA, the shutter 53 may be closed. Further, during the reciprocating movement of the laser beam LB, the shutter 53 is closed in the accelerating/decelerating sections AM1, AM2, AM3, and AM4 of the target aiming point of the laser beam LB, and is opened only in the uniform motion sections UM1 and UM2 such that the laser beam LB may be irradiated on the target substrate 10 while moving at a constant speed. Therefore, the number (n) of scans of the laser beam LB per unit area in the cutting line CL is uniform, such that uniform energy may be provided to each area in the cutting line CL.

In a case of controlling the laser beam LB through on/off of the laser providing unit 40 itself, it may be difficult to immediately control the laser beam LB in real time due to a time required to drive the laser providing unit 40. However, in accordance with the laser apparatus 1 and the method for manufacturing the display device DD according to an embodiment, it is possible to control (e.g., immediately control) whether to irradiate the laser beam LB in real time by controlling the laser beam LB through opening/closing of the shutter 53 in a state in which the laser beam LB is continuously emitted from the laser providing unit 40.

While some embodiments have been described herein, those skilled in the art will appreciate that many variations and modifications can be made to the described embodiments without substantially departing from the principles of the present invention. Therefore, the disclosed embodiments of the invention are provided in a generic and descriptive sense only and not for purposes of limitation.

What is claimed is:

1. A laser apparatus comprising:
a stage;
a laser provider above the stage and configured to provide a laser beam;
a scanner configured to adjust an optical path of the laser beam such that the laser beam is irradiated to an irradiation line formed above the stage; and
a controller to control an operation of the scanner,
wherein the scanner includes a shutter located on an optical path of the laser beam emitted from the laser providing unit provider and configured to perform an opening/closing operation,
wherein the controller calculates a processing area to which the laser beam is irradiated and a non-processing area to which the laser beam is not irradiated, and
wherein, when a position of a target aiming point of the laser beam is located in the processing area, the controller controls to open the shutter if a moving speed of the target aiming point of the laser beam is higher than or equal to a reference speed, and to close the shutter if the moving speed of the target aiming point of the laser beam is lower than the reference speed.

2. The laser apparatus of claim 1, wherein the controller controls to close the shutter when the position of the target aiming point of the laser beam is located in the non-processing area.

3. The laser apparatus of claim 1, wherein a number of scans of the laser beam per unit area in the processing area is uniform for each area.

4. The laser apparatus of claim 1, wherein the scanner comprises at least one mirror configured to swing the laser beam, and
a target aiming point of the laser beam is moved while repeating forward movement to a first side in a moving direction and backward movement to a second side in the moving direction through the swing of the laser beam using the at least one mirror.

5. The laser apparatus of claim 4, wherein a forward moving distance of the target aiming point of the laser beam is greater than a backward moving distance thereof.

6. The laser apparatus of claim 5, wherein a moving speed of the target aiming point of the laser beam during the forward movement and the backward movement is constant.

7. The laser apparatus of claim 1, wherein the laser provider emits a laser beam during a first period in which the shutter is opened to irradiate the laser beam to the irradiation line and a second period in which the shutter is closed so as not to irradiate the laser beam to the irradiation line.

8. A laser apparatus comprising:
a stage;
a laser provider above the stage and configured to provide a laser beam;
a scanner configured to adjust an optical path of the laser beam such that the laser beam is irradiated to an irradiation line formed above the stage; and
a controller to control an operation of the scanner,
wherein the scanner includes a shutter located on an optical path of the laser beam emitted from the laser provider and configured to perform an opening/closing operation,
wherein the controller calculates a processing area to which the laser beam is irradiated and a non-processing area to which the laser beam is not irradiated,
wherein the scanner comprises at least one mirror configured to swing the laser beam, and
a target aiming point of the laser beam is moved while repeating forward movement to a first side in a moving direction and backward movement to a second side in the moving direction through the swing of the laser beam using the at least one mirror, and
wherein the calculation of the processing area and the non-processing area through the controller is performed using a shape of the irradiation line, a unit forward moving distance of the laser beam, a number of scans of the laser beam per unit area, and position information of the stage.

9. A laser apparatus comprising:
a laser provider configured to emit a laser beam during a first period and a second period;
an optical path adjuster configured to adjust an angle at which the laser beam travels;
a shutter located on a traveling path of the laser beam; and
a controller to control operations of the optical path adjustment unit adjuster and the shutter,
wherein the shutter is opened during the first period to allow the emitted laser, beam to travel, and is closed during the second period to block travel of the emitted laser beam,
wherein the controller calculates a processing area to which the laser beam is irradiated and a non-processing area to which the laser beam is not irradiated, and
wherein, during the first period, a target aiming point of the laser beam is located in the processing area and moves at a speed higher than or equal to a reference speed.

10. The laser apparatus of claim 9, wherein the first period and the second period are consecutive periods.

11. The laser apparatus of claim 9, wherein, during the second period, the target aiming point of the laser beam is located in the non-processing area, or is located in the processing area and moves at a speed lower than the reference speed.

12. The laser apparatus of claim 9, wherein, during the first period, a number of scans of the laser beam per unit area is uniform for each area.

* * * * *